United States Patent
Ghannouchi et al.

(10) Patent No.: US 12,348,190 B2
(45) Date of Patent: Jul. 1, 2025

(54) DIGITAL DOHERTY TRANSMITTER

(76) Inventors: Fadhel Ghannouchi, Calgary (CA);
Ramzi Darraji, Calgary (CA)

(*) Notice: Subject to any disclaimer, the term of this patent is extended or adjusted under 35 U.S.C. 154(b) by 3679 days.

(21) Appl. No.: 13/105,852

(22) Filed: May 11, 2011

(65) Prior Publication Data
US 2022/0077825 A1    Mar. 10, 2022

(51) Int. Cl.
*H03F 1/02* (2006.01)
*H03F 1/32* (2006.01)
*H03F 3/24* (2006.01)

(52) U.S. Cl.
CPC .......... *H03F 1/0288* (2013.01); *H03F 1/3247* (2013.01); *H03F 3/24* (2013.01); *H03F 2200/451* (2013.01)

(58) Field of Classification Search
CPC ........ H03F 1/0288; H03F 1/3247; H03F 3/24; H03F 2200/451
USPC ............................... 330/10, 124 R, 295, 136
See application file for complete search history.

(56) References Cited

U.S. PATENT DOCUMENTS

| | | | | |
|---|---|---|---|---|
| 6,054,894 A | * | 4/2000 | Wright | H03F 1/3247 330/149 |
| 7,184,490 B1 | * | 2/2007 | Rybicki | H03F 1/0205 330/149 |

* cited by examiner

*Primary Examiner* — Andrea Lindgren Baltzell
*Assistant Examiner* — Khiem D Nguyen

(57) ABSTRACT

A digital Doherty amplifier compromises a baseband signal processing block including a digital predistortion unit, a digital signal distribution unit and a digital phase alignment unit; a signal up-conversion block, an RF power amplification block, the RF power amplification block including the carrier amplifier and one or two peaking amplifiers; and a RF Doherty combining network. In another aspect, a digital Doherty amplifier compromises a baseband signal block including a digital predistortion unit, a digital signal distribution unit and an adaptive digital phase alignment unit; a signal up-conversion block; a signal up-conversion block, the signal up-conversion block including three digital-to-analog converters (DACs) and a tri-channel up-converter or three single-channel up-converters; a RF power amplification block, the RF power amplification block including the carrier amplifier and two peaking amplifiers; and an RF Doherty combining network which includes quarter wavelength impedance transformers.

14 Claims, 22 Drawing Sheets

DIGITAL DOHERTY TRANSMITTER

CROSS-REFERENCE TO RELATED APPLICATIONS

Not Applicable.

STATEMENT REGARDING FEDERALLY SPONSORED RESEARCH

Not Applicable.

APPENDIX

Not Applicable.

BACKGROUND OF THE INVENTION

Field of the Invention

The present invention relates to digital Doherty transmitters.

Related Art

To cope with the ever-increasing number of wireless networks users, modern wireless communication standards (3rd generation and beyond) employ spectrum efficient modulation and access techniques, such as quadratic amplitude modulation (QAM), orthogonal frequency division multiplexing (OFDM) and code division multiple access (CDMA). Although these techniques permit an efficient management of the overcrowded radio frequency (RF) spectrum, they also result in creating highly varying envelope signals that are characterized with high peak-to-average power ratio (PAPR). To avoid signal clipping and loss of transmitted information through distortion during power amplification, the transmitter should handle the peak values of the transmitted signal even though it mostly operates at significantly lower average power levels. Accordingly, the power amplifier (PA) of wireless transmitter is forced to operate at large back-off from its saturation point where the power efficiency of the PA drops drastically.

A popular power amplification architecture for enhancing the efficiency at backed-off output power region is the Doherty amplifier architecture. Fundamentally, a Doherty amplifier is composed of: 1) one main amplifier (commonly denoted as carrier amplifier) that is operating in class-AB and performing signal amplification for all input signal levels, 2) at least one auxiliary amplifier (commonly denoted as peaking amplifier) that is operating in class-C and performing signal amplification starting from a predefined signal level, 3) an input analog power divider for splitting the input signal between the carrier amplifier and the peaking amplifier(s), 4) a non-isolated Doherty output power combiner for combining the outputs of the carrier amplifier and the peaking amplifier(s) which comprises quarter wavelength transformers, and 5) 50 Ohms lines inserted at the input of the peaking amplifiers and/or carrier amplifier to balance the delay between the branches of the Doherty amplifier. The use of a non-isolated power combiner initiates an active load modulation mechanism that is based on dynamically changing the load presented to the carrier amplifier through the impedance modulation triggered by the peaking amplifier(s). This allows the carrier amplifier to operate efficiently until it reaches its optimal load while the peaking amplifier(s) is/are simultaneously contributing to the output power of the Doherty amplifier.

Practically, the two-stage Doherty amplifier which consists of one carrier amplifier and one peaking amplifier; and, the three-stage Doherty amplifier which consists of one carrier amplifier and two peaking amplifiers are the most used architectures in Doherty based RF transmitters. Practical implantations of four-stage and higher order-stage Doherty amplifiers are rare and not fully convincing in their performance. The main reasons are the rather complex design and the excessive costs of implementation for no significant performance improvement as compared to the two or three-stage Doherty amplifier architecture.

Ideally, two-stage (three-stage) Doherty amplifier has two (three) maximum efficiency points located within a range of up-to 6 dB (12 dB) of output power back-off relatively to the saturation output power point. This feature makes the two-stage and three-stage Doherty amplifiers the most suitable architectures for power amplification in 3rd generation and beyond wireless communications applications where the PAPR of the modulated signals is typically ranging between 6 and 12 dB. In practice, two-stage Doherty amplifiers are more suitable when the PAPR is about or slightly higher than 6 dB and three-stage Doherty amplifiers when the PAPR of the signal is significantly higher that than 6 dB. The achievement of such a superior performance requires a quasi-perfect load modulation mechanism which is not likely to happen in fully-analog implementations due to limitations related to inherent hardware impairments in the RF blocks of two-stage or three-stage Doherty amplifiers.

In the case of two- or three-stage Doherty amplifier, the dissimilarity in class of operation of the carrier amplifier and the one or two peaking amplifiers results in complex gain fluctuation between the output branches of the Doherty amplifier. As a result, the output signal amplitude from the carrier amplifier and the output signal amplitudes from peaking amplifiers do not match with the ideal current profiles governing the correct operation of the Doherty amplifier. This translates into an imperfect load modulation mechanism and degraded efficiency.

In a number of device (transistor) technologies (such as high electron-mobility transistor (HEMT) and gallium nitride (GaN), etc.), the difference in bias conditions between the carrier amplifier and peaking amplifiers results in power-dependent and highly nonlinear phase misalignment within the output branches of the Doherty amplifier which causes severe output power loss, deficient load modulation and degraded efficiency.

Another problem related to power loss within two-stage or three-stage Doherty amplification architectures is that a lot of input drive power is wasted into the peaking paths while the peaking amplifiers are in the turn-off state at low power drive levels.

SUMMARY OF THE INVENTION

In one aspect of the present invention, a digital Doherty amplifier compromises a baseband signal processing block, the baseband signal processing block including a digital predistortion unit, an adaptive digital signal distribution unit and a dynamic adaptive digital phase alignment unit; a signal up-conversion block, an RF power amplification block, the RF power amplification block including the carrier amplifier and one or two peaking amplifiers; and an RF Doherty combining network, the topology of the RF Doherty combining network is predefined and it depends on the number of stage and the setting of turn-on points of the amplifiers blocks of the Doherty amplifier system.

In the description of the invention, a three-stage Doherty amplifier will be used. It is noted that a two-stage Doherty amplifier which includes one peaking amplifier may be considered in one sense a simple and special case of three-stage Doherty amplifier architecture that has two peaking amplifiers.

In another aspect of the present invention, a digital Doherty amplifier compromises a baseband signal processing block, the baseband signal processing block including a digital predistortion unit, an adaptive digital signal distribution unit and an adaptive digital phase alignment unit; a signal up-conversion block; a signal up-conversion block, the signal up-conversion block including three digital-to-analog converters (DACs) and a tri-channel up-converter or three single-channel up-converter; a RF power amplification block, the RF power amplification block including the carrier amplifier and two peaking amplifiers; and a RF Doherty combining network which includes quarter wavelength impedance transformers, the topology of the RF Doherty combining network is predefined and it depends on the number of stage, mode and order of operation of the Doherty amplifier.

Further areas of applicability of the present invention will become apparent with reference to the following drawings, description and claims. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Broadly, an embodiment of the present invention provides a multiple branch digital Doherty transmitter architecture and digital signal processing algorithms for impairments-free operation and linearized three-stage Doherty amplifier.

Figure 1:
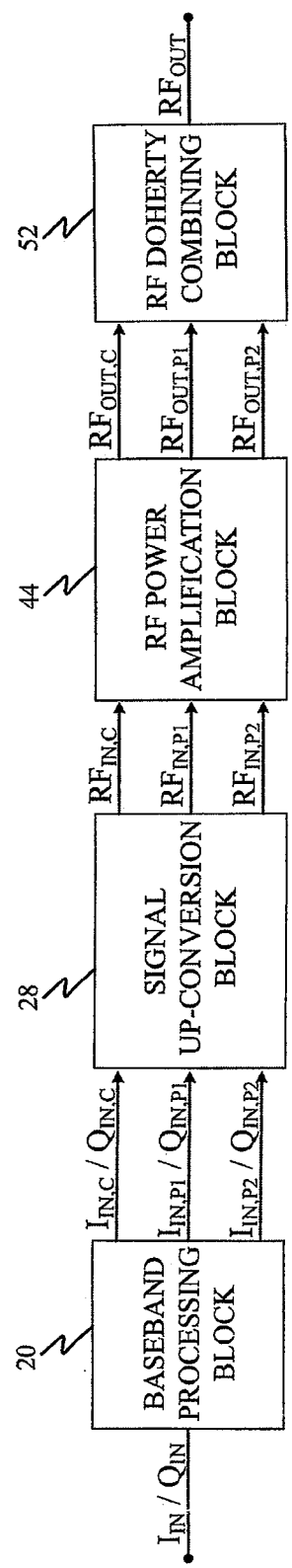
FIG. 1 is a block diagram of the digital Doherty transmitter architecture according to an exemplary embodiment of the present invention.
Figure 2:
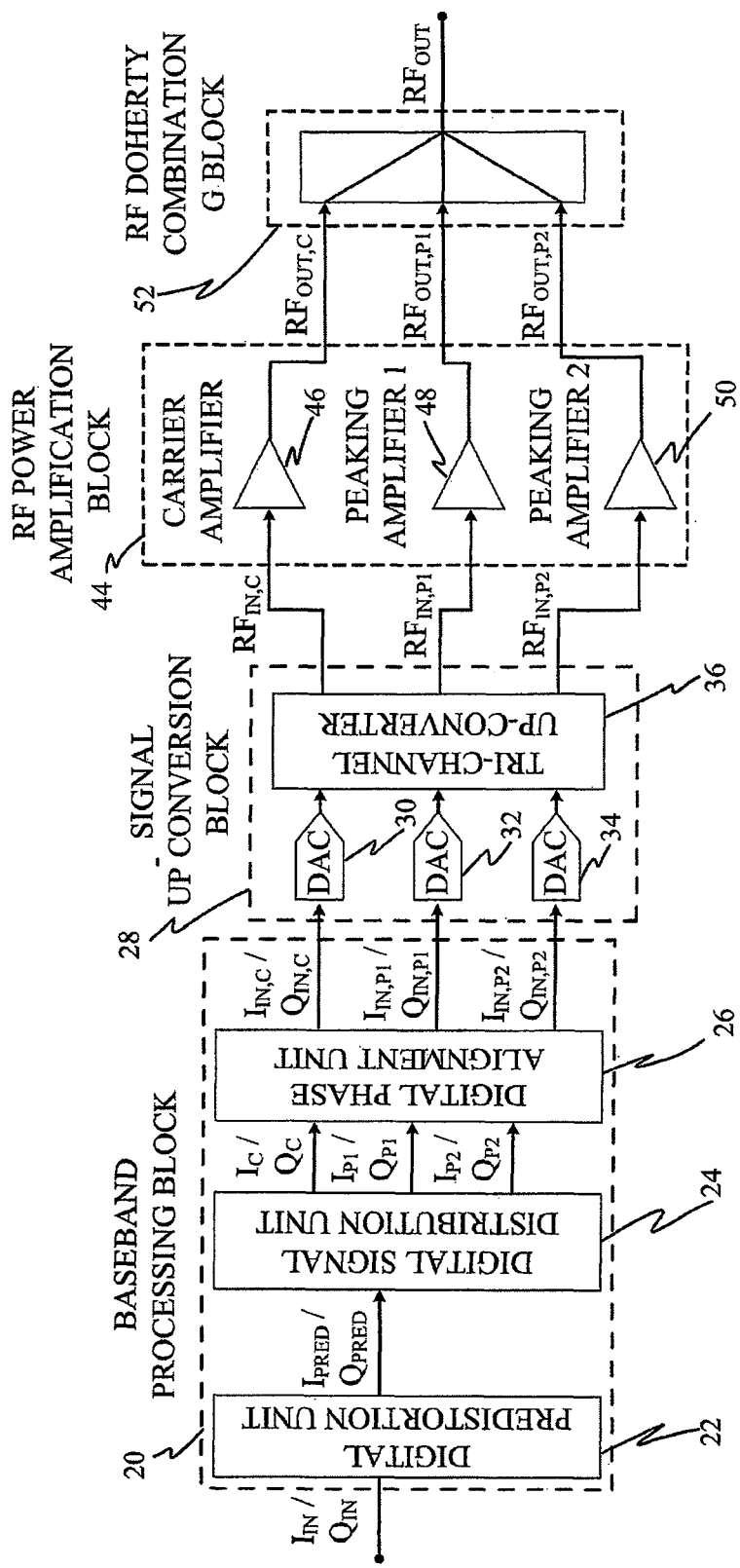
FIG. 2 is one embodiment illustrating a detailed block diagram of the architecture of FIG. 1, using a single tri-channel up-converter.
Figure 3:
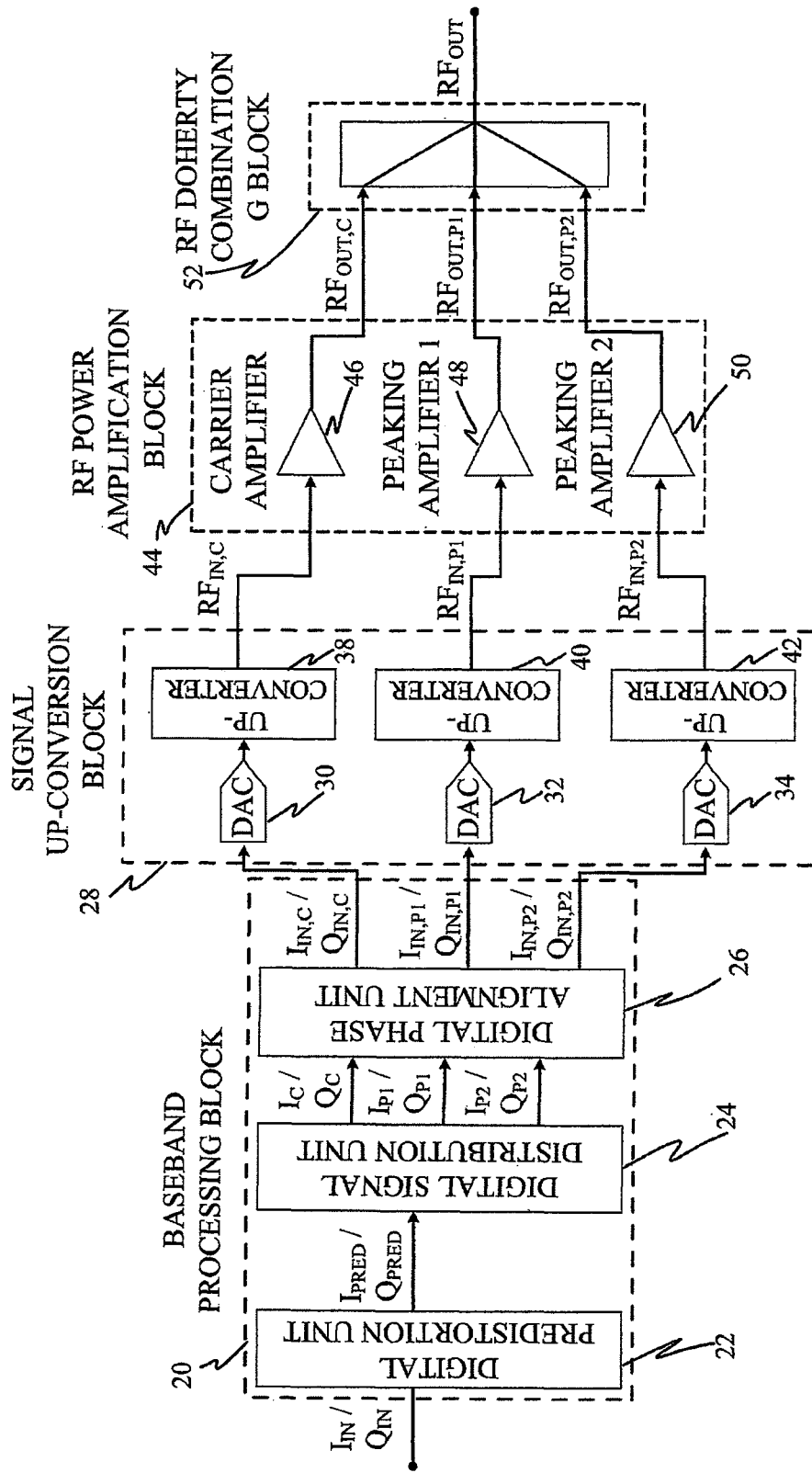
FIG. 3 is an alternate embodiment illustrating a detailed block diagram of the architecture of FIG. 1, using three single channel up-converters.

As seen in FIGS. 1-3, for a given mode of operation of the digital Doherty transmitter and starting from an initial baseband signal, shown at $I_{IN}/Q_{IN}$, corresponding to a given communication standard, the baseband processing Block 20 generates three different input baseband signals ($I_{IN,C}/Q_{IN,C}$, $I_{IN,P1}/Q_{IN,P1}$, $I_{IN,P2}/Q_{IN,P2}$) so that, after up-conversion via Signal Up-Conversion Block 28 and RF power amplification via RF Power Amplification Block 44, the magnitudes of the currents at the input of the RF Doherty Combining Network 52 follow the ideal currents profile that is predefined depending on the mode of operation of the multiple stage Doherty transmitter.

Figure 4:
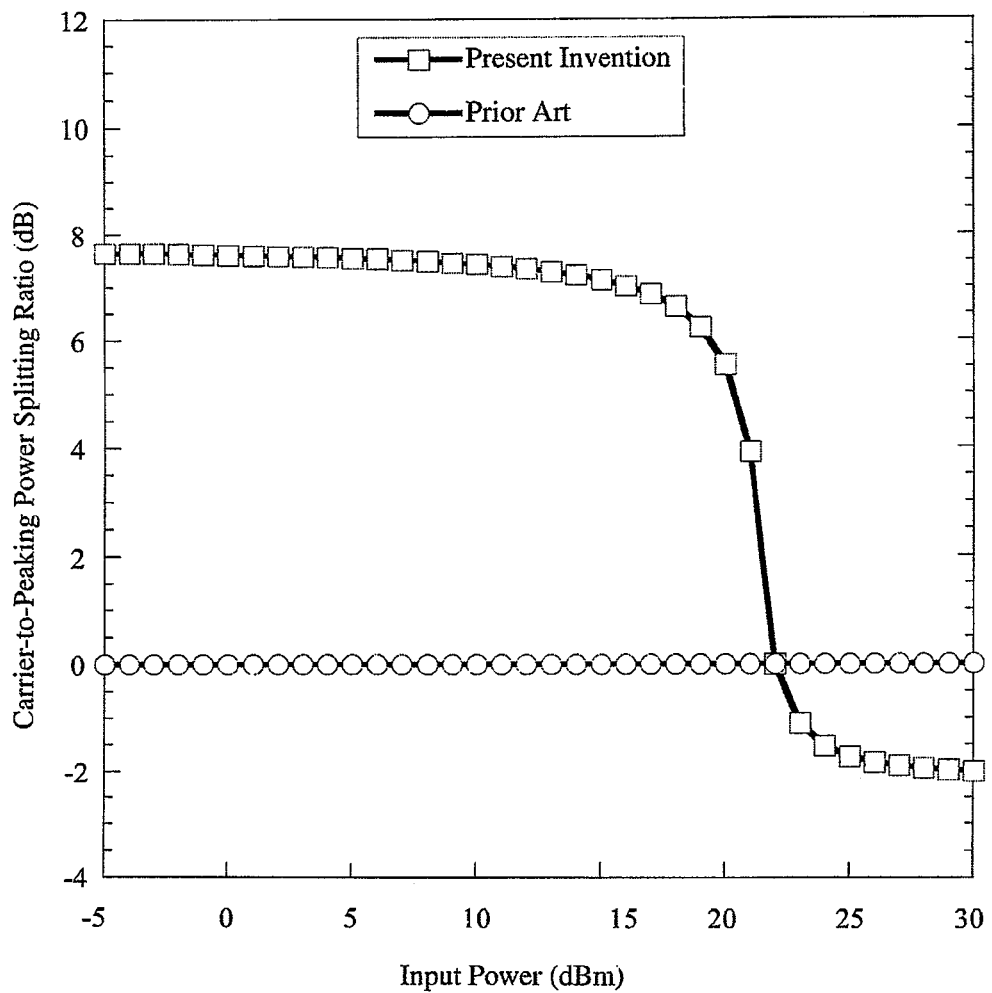
FIG. 4 is an example of a possible signal distribution scheme of an exemplary embodiment of the present invention.

FIG. 4 shows an example of a possible signal distribution scheme executed at the digital signal distribution unit 24 of an exemplary embodiment of the present invention where the RF power amplification block has only one peaking amplifier. The Present Invention graph line illustrates the digital Doherty transmitter, while the Prior Art graphline illustrates the state of the prior art.

Figure 5:
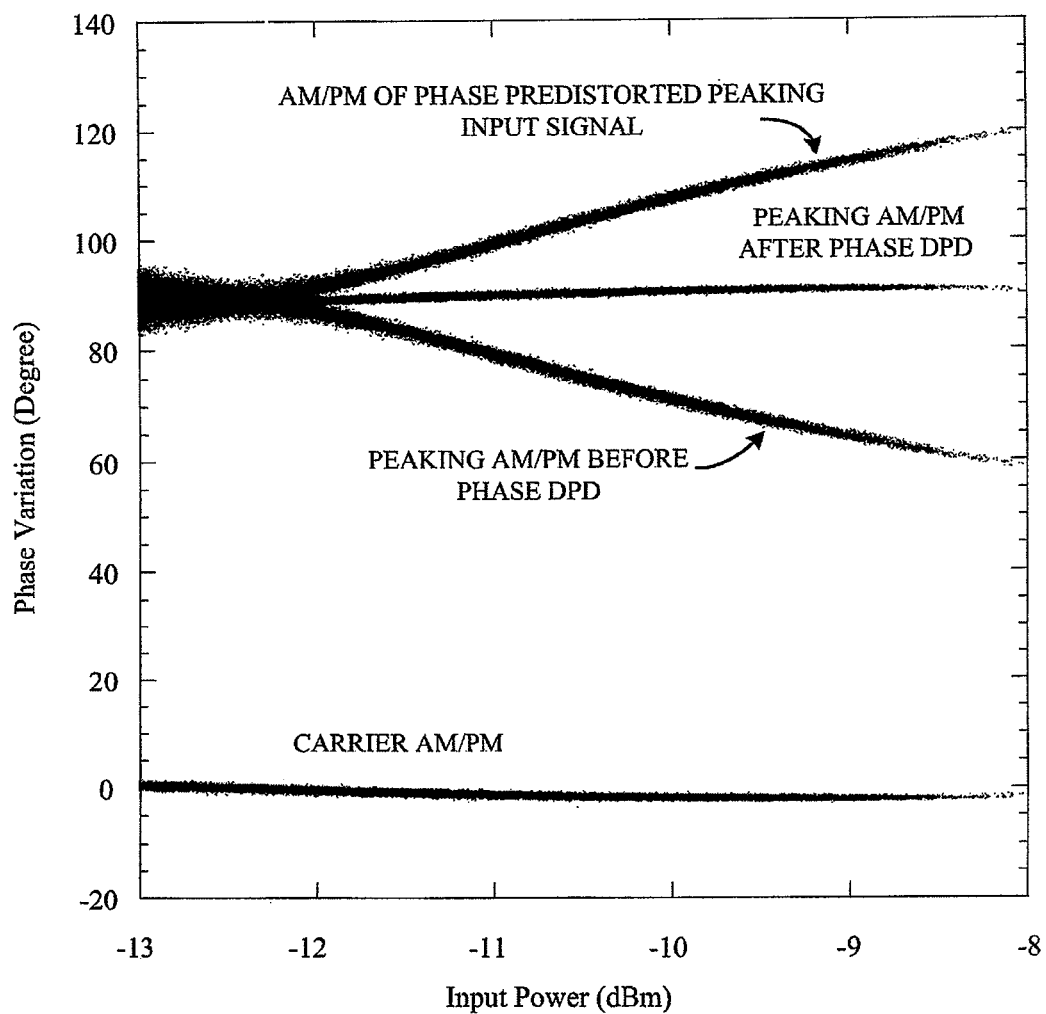
FIG. 5 is an example of a possible phase alignment mechanism of an exemplary embodiment of the present invention.

The baseband signals generated at the digital signal distribution unit 24 are further updated to compensate for any phase misalignment resulting from the non-linear behavior of the devices. The phase misalignment behavior is identified from the amplitude-dependent phase distortion (AM/PM) of the carrier amplifier and the (AM/PM) responses of the peaking amplifiers. The characterization can be achieved by only driving one amplifier at a time with its specific input signal generated at the digital signal distribution unit 24 and collecting its corresponding amplified signal at the output of the digital Doherty transmitter. The output RF signal is down-converted to baseband and benchmarked against the known driving input baseband signal which permits obtaining the AM/PM of the amplifier under test. In the case that the AM/PM responses of the three amplifiers follow similar trend (i.e., AM/PM is quasi-constant versus input power) but with a constant phase difference, a static digital phase alignment is applied to the input baseband data at the input of each peaking branch to align the AM/PM response of the peaking amplifiers with that of the carrier amplifier. In the case that the AM/PM responses of the peaking amplifiers do not follow the same trend as that of the carrier amplifier (i.e., AM/PM responses of peaking amplifiers fluctuate versus input power), an adaptive digital phase alignment is applied to the baseband data at the input of each branch to ensure that the AM/PM response of the carrier amplifier and those of the peaking amplifiers are overlapping at all time. This may be achieved by applying phase digital predistortion (PDPD) to each peaking input baseband signal. This results in three similar AM/PM responses having a constant phase shift that can be aligned as in the case of static phase alignment by just adding a constant phase offset to the input signal. The graph presented in FIG. 5 shows an example of a possible adaptive digital phase alignment of an exemplary embodiment of the present invention where the RF power amplification block 44 has only one peaking amplifier and where the carrier amplifier and peaking amplifier have dissimilar AM/PM characteristics.

The digital phase alignment mechanism ensures the quasi-perfect active load modulation behavior (when the input signal is properly distributed at the digital signal distribution unit 24) and prevents the destructive power summation at the RF Doherty combining network.

Both digital adaptive signal distribution unit and digital phase alignment unit ensure the impairments-free operation of the multiple (three) stage digital Doherty transmitter.

To get the linear operation, the digital predistortion (DPD) is required. This can be achieved by considering the system that consists of {digital adaptive signal distribution unit+ digital phase alignment unit 26+signal up-conversion block 28+RF power amplification block 44+RF Doherty combining network 52} as device-under-test (DUT). As such, the initial characterization and DPD model identification of the digital Doherty transmitter can be derived based on the initial input baseband signal and the equivalent baseband version of the RF signal at the output of the RF Doherty combining network 52.

A digital predistortion technique consisting of pre-processing an input baseband signal according to the complement of the transmitter response to compensate for its nonlinearity effects. To achieve this correction, a complex function of the predistorter is determined while satisfying the following conditions:

$$f(x_{out}(t)/G) = x_{in}(t) \text{ and } g(x_{in}(t)) = x_{out}(t)$$

$$\text{with } f[g(x_{in}(t))] = G[x_{in}(t)]$$

where f and g represent the complex nonlinear functions of the predistorter and the PA/transmitter, respectively. G represents the small-signal gain of the Doherty amplifier. The variables $x_{in}$ and $x_{out}$ denote the input and output signals respectively. Both f and g are determined using baseband records at the input and output of the Doherty transmitter.

Following the identification of the predistorter and its cascade before the digital signal distribution unit 24, one can write the following equation for the linearized transmitter:

$$x_{out}(t) = g[f(x_{in}(t))] = G[x_{in}(t)]$$

Referring to FIG. 1, the digital Doherty amplifier/transmitter architecture includes a baseband signal processing block 20; a signal up-conversion block 28; a RF power amplification block 44; and a RF Doherty combining network 52, the topology of the RF Doherty combining network is predefined topologies and is depending on the mode of operation of the multiple branch digital Doherty amplifier/transmitter of the present invention. The specific number of multiple branches n of the digital Doherty amplifier/transmitter of the present invention architecture is equal to one (carrier amplifier branch) plus the value n−1 which value equals the number of peaking amplifiers in a particular circuit.

Figure 14:
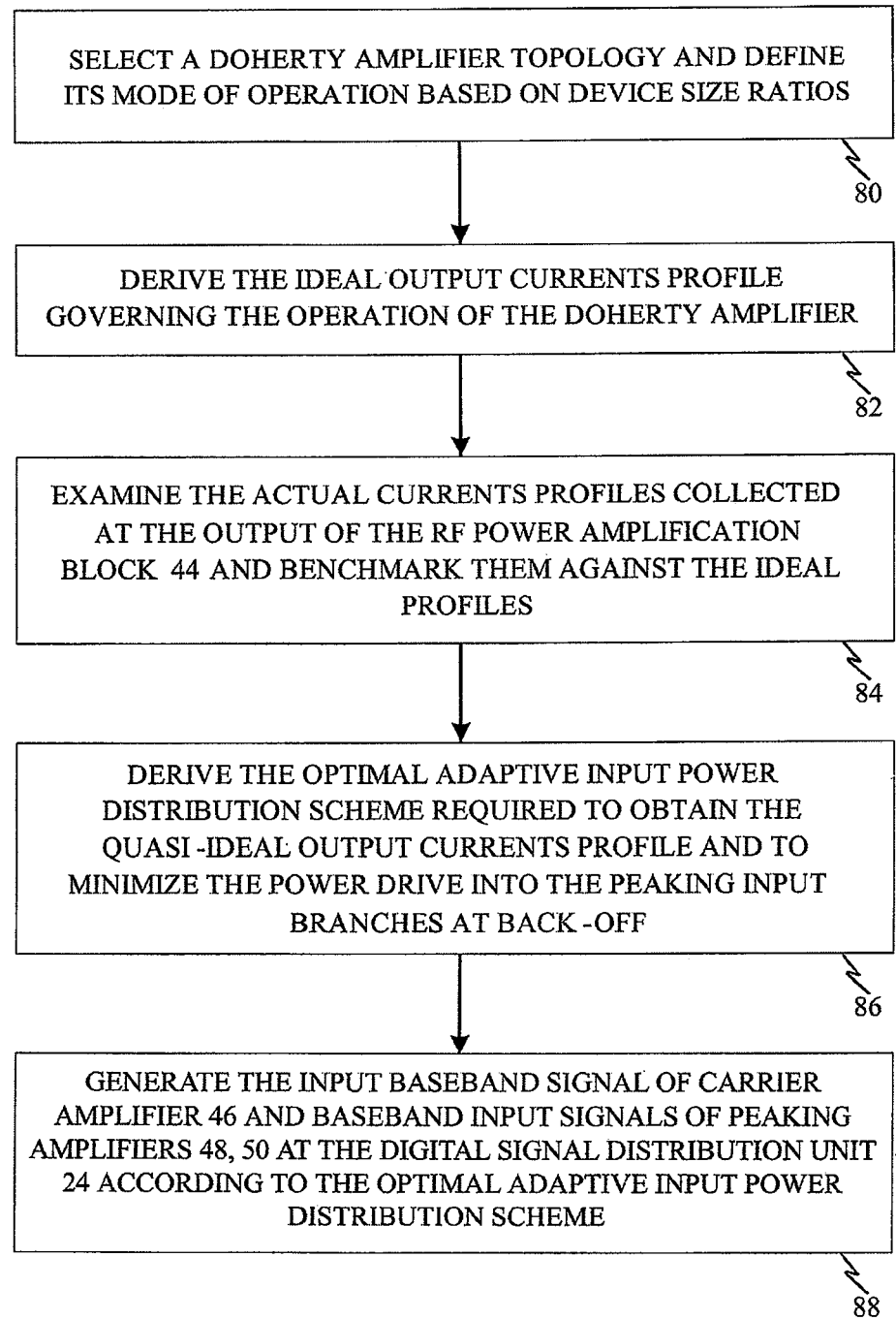
FIG. 14 is a flowchart illustrating the steps of the execution of the digital adaptive signal distribution algorithm performed by Digital Signal Distribution Unit of the Baseband Processing Block.
Figure 15:
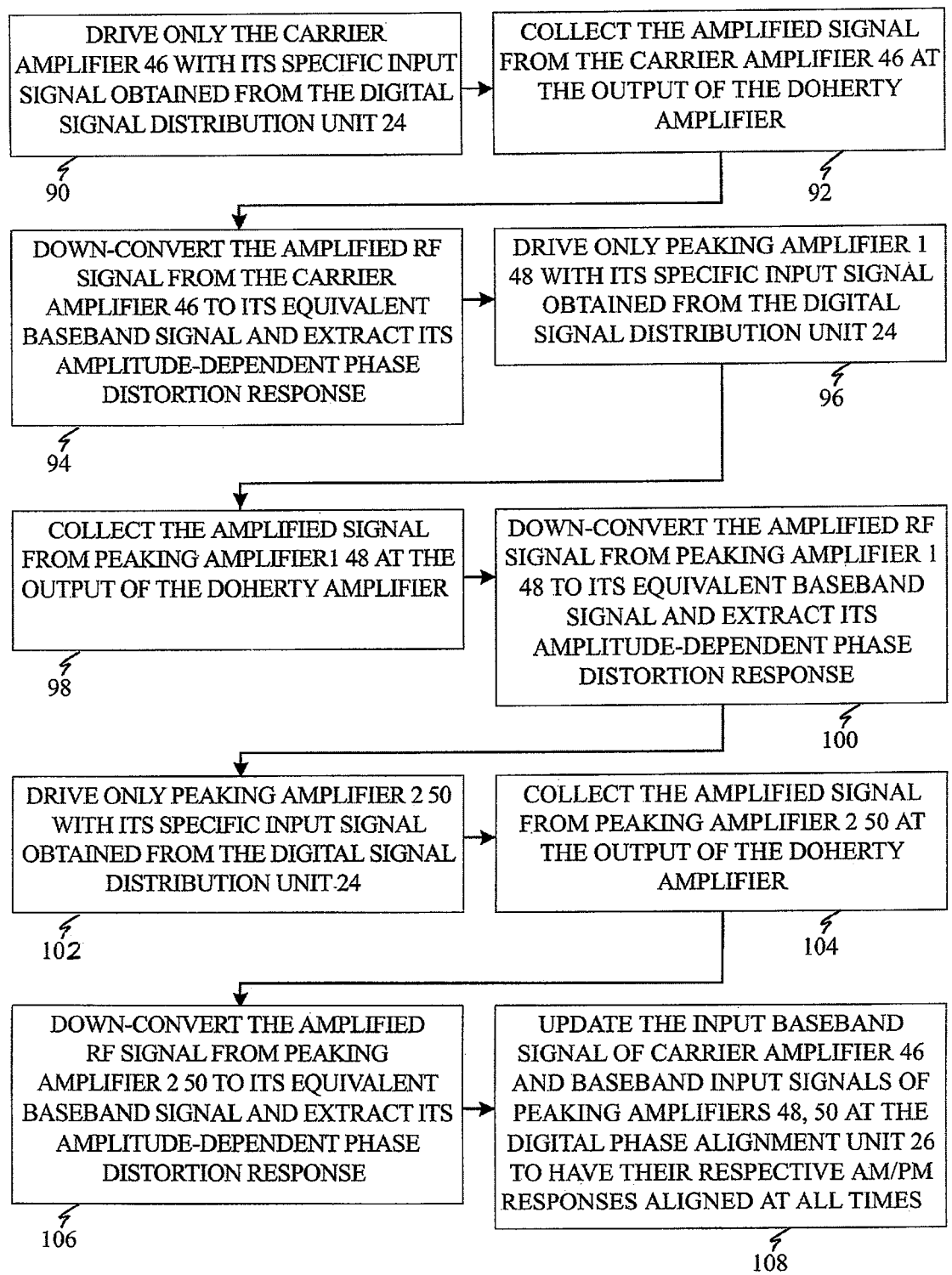
FIG. 15 is a flowchart illustrating the steps of the execution of the digital phase alignment algorithm for the Digital Phase Alignment Unit of the Baseband Processing Block.
Figure 16:
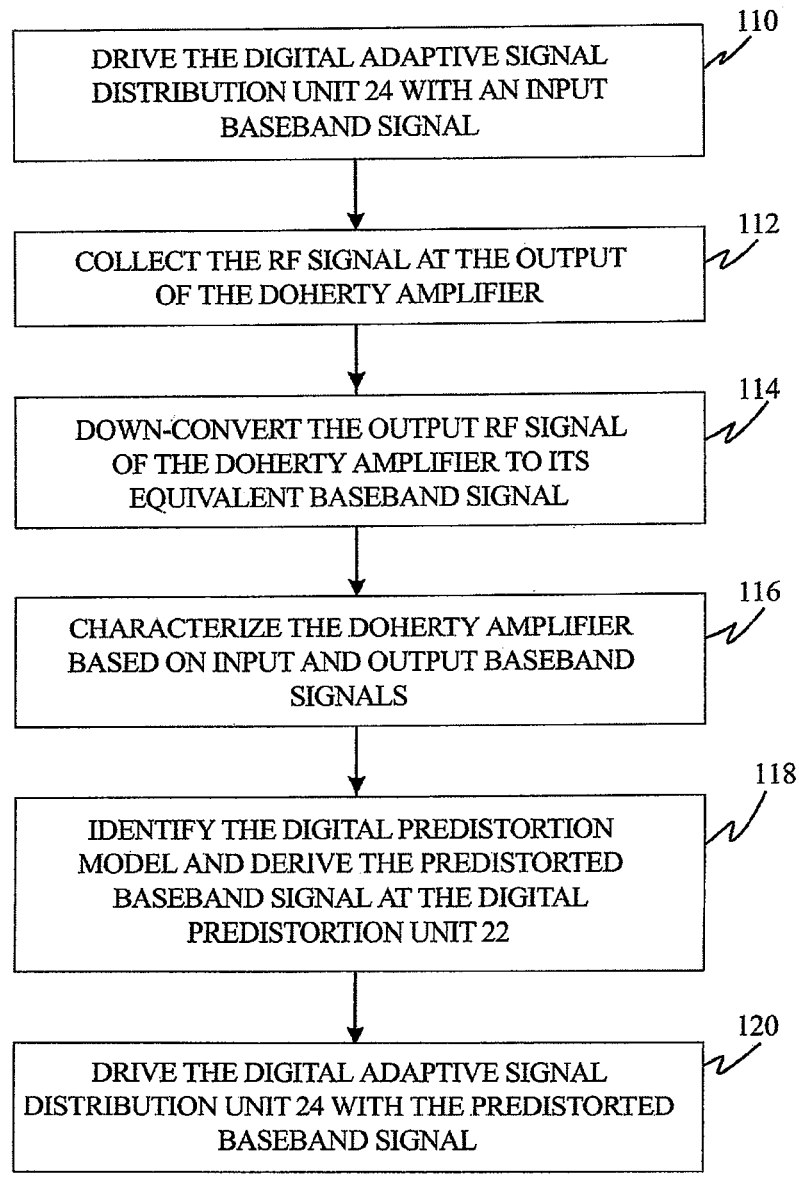
FIG. 16 is a flowchart illustrating the steps of the execution of the digital predistortion (EPE) algorithm for the Digital Predistortion Unit of the Baseband Processing Block.
Figure 17:
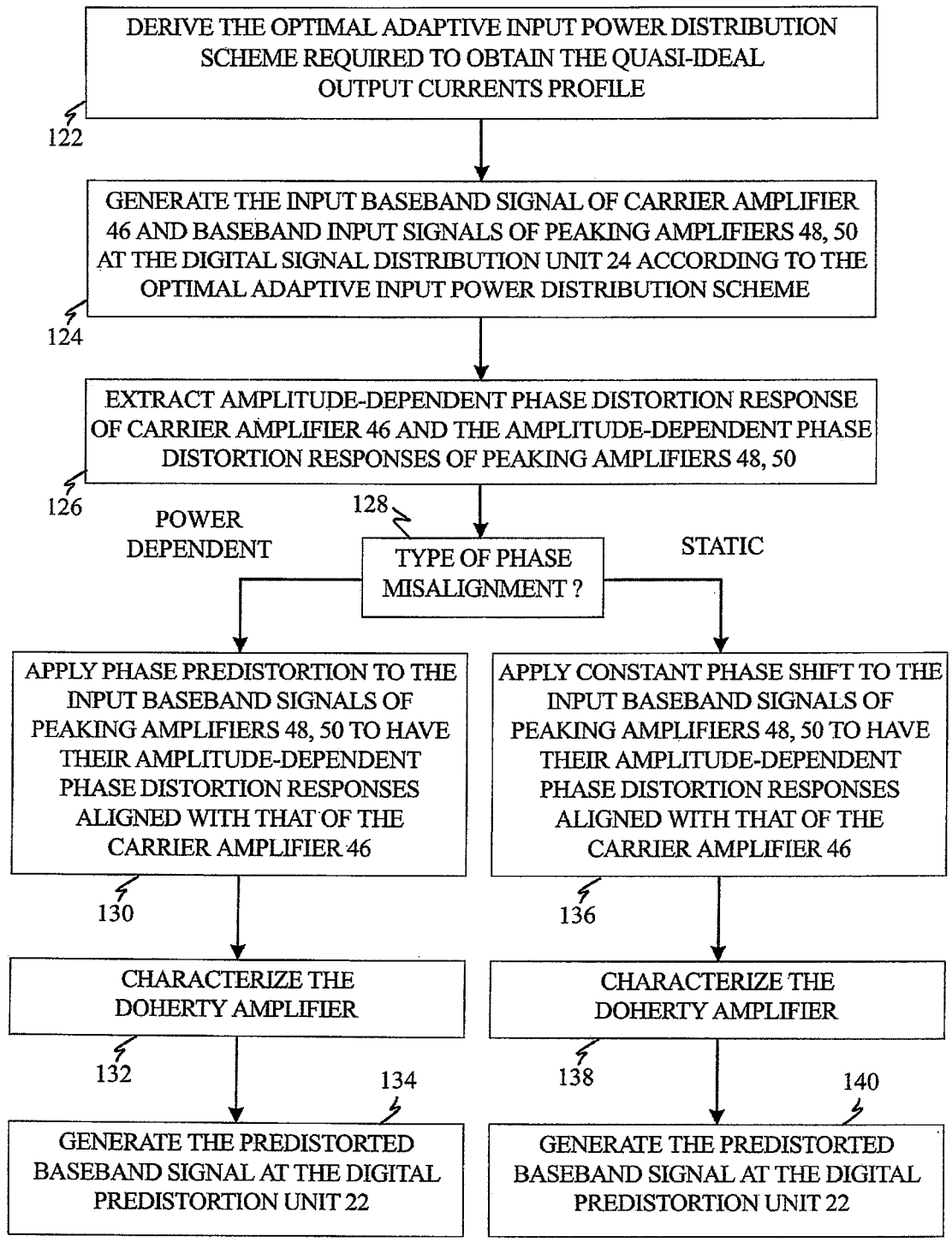
FIG. 17 is a flowchart illustrating the steps of the Baseband Signal Processing Block of the present invention.

The baseband signal processing block 20 includes a digital predistortion unit 22, an adaptive digital signal distribution unit 24 and a digital phase alignment unit 26. The baseband signal processing block 20 is a set of digital signal processing algorithms best shown in FIG. 17 that are implemented to ensure impairments-free and linear operation of multiple-stage Doherty amplifiers/transmitters. In this regard, the implementation of digital predistortion unit 22 is best shown in FIG. 16; the implementation of digital signal distribution unit 24 is best shown in FIG. 14; the implementation of digital phase alignment unit 26 is best shown in FIG. 15. The operation and algorithms performed by baseband signal processing block 20 allow for digital processing of digital signals, and for a digital signal output.

In operation, the digital predistortion unit 22 is an algorithm that takes the initial input digital baseband in-phase/quadrature ($I_{IN}/Q_{IN}$) signal to generate the predistorted baseband digital signal ($I_{Pred}/Q_{Pred}$) intended to feed the digital adaptive signal separation unit 24 according to the equations stated above (see FIG. 16).

The digital signal distribution unit 24 is an algorithm that is applied (according to FIG. 14) to the digital baseband signal ($I_{Pred}/Q_{Pred}$) obtained from the digital predistortion unit 24 to generate the digital baseband signals ($I_C/Q_C$), ($I_{P1}/Q_{P1}$) and ($I_{P2}/Q_{P2}$) to: first, ensure that, after up-conversion and RF power amplification, the magnitudes of the currents at the input of the RF Doherty combining network follow the ideal currents profile for the mode of operation of the multiple branch digital Doherty transmitter; and second, to minimize the waste of input power into the peaking branches while peaking amplifiers are in the turn-off state.

The digital phase alignment unit 26 is an algorithm (according to FIG. 15) that is applied to the baseband signal ($I_C/Q_C$), ($I_{P1}/Q_{P1}$) and ($I_{P2}/Q_{P2}$) to generate the baseband signals ($I_{IN,C}/Q_{IN,C}$), ($I_{IN,P1}/Q_{IN,P1}$) and ($I_{IN,P2}/Q_{IN,P2}$) in order to compensate in digital domain for the phase imbalance problem.

Referring to FIG. 2, the signal up-conversion block 28 may include first, second and third digital-to-analog converters (DACs) 30, 32, and 34, respectively, and a tri-channel up-converter 36. The DACs 30, 32, 34 and the tri-channel up-converter 36 may be any commercially available parts. Each DAC 30, 32, 34 is an electrical device that converts the baseband streams ($I_{IN,C}/Q_{IN,C}$), ($I_{IN,P1}/Q_{IN,P1}$) and ($I_{IN,P1}/Q_{IN,P1}$) obtained at the output of the baseband signal processing block 20 into continuous analog signals. The tri-channel up-converter 30 is an electrical device that takes the low frequency input analog signals from the DACs 30, 32, 34 to produce the RF signals $RF_{IN,C}$ (from first single-channel up-converter 38), $RF_{IN,P1}$ (from second single-channel up-converter 40), and $RF_{IN,P2}$ (from third single-channel up-converter 42) that are feeding the input of the RF power amplification block 44.

Referring to FIG. 2, the signal up-conversion block 28 may include three digital-to-analog converters (DACs) 30, 32, 34, respectively, and first, second, and third single-channel up-converters 38, 40, 42, respectively. The DACs 30, 32, 34 and the single-channel up-converter 38, 40, 42 may be any commercially available parts. Each DAC 30, 32, 34 is an electrical device that converts the baseband streams ($I_{IN,C}/Q_{IN,C}$), ($I_{IN,P1}/Q_{IN,P1}$) and ($I_{IN,P1}/Q_{IN,P1}$) obtained at the output of the baseband signal processing block 20 into continuous analog signals. The up-converter 36 is an electrical device that takes the low frequency input analog signals from the DACs 30, 32, 34 to produce the RF signals $RF_{IN,C}$, $RF_{IN,P1}$ and $RF_{IN,P2}$ that are feeding the input of the RF power amplification block 44.

Referring to FIG. 2 and FIG. 3, the RF power amplification block 44 includes the carrier amplifier 46 and two peaking amplifiers 48 and 50. The carrier amplifier 46 is an electrical device that amplifies the input radio frequency signal $RF_{IN,C}$. The two peaking amplifiers 48 and 50 are electrical devices that amplify the input radio frequency signals $RF_{IN,P1}$ and $RF_{IN,P2}$. The carrier amplifier 46 and peaking amplifiers 48 and 50 are implemented based on transistors and input and output matching networks. The matching networks may be implemented using passive distributed elements, transmission lines based structures or lumped elements.

In one possible configuration of the multiple stage/branch Doherty transmitter, the transistor of the carrier amplifier 46 and the transistors of the peaking amplifiers 48 and 50 are identical in size. In other possible configurations of the multiple stage/branch Doherty amplifier, the transistors of the carrier amplifier 46 and the transistors of the peaking amplifiers 48 and 50 have different sizes. For a given configuration of device's size ratio between the carrier device and peaking devices, there is predefined mode of operation and ideal output fundamental current profile describing the proper operation of the multiple stage/branch Doherty amplifier.

Figure 6:
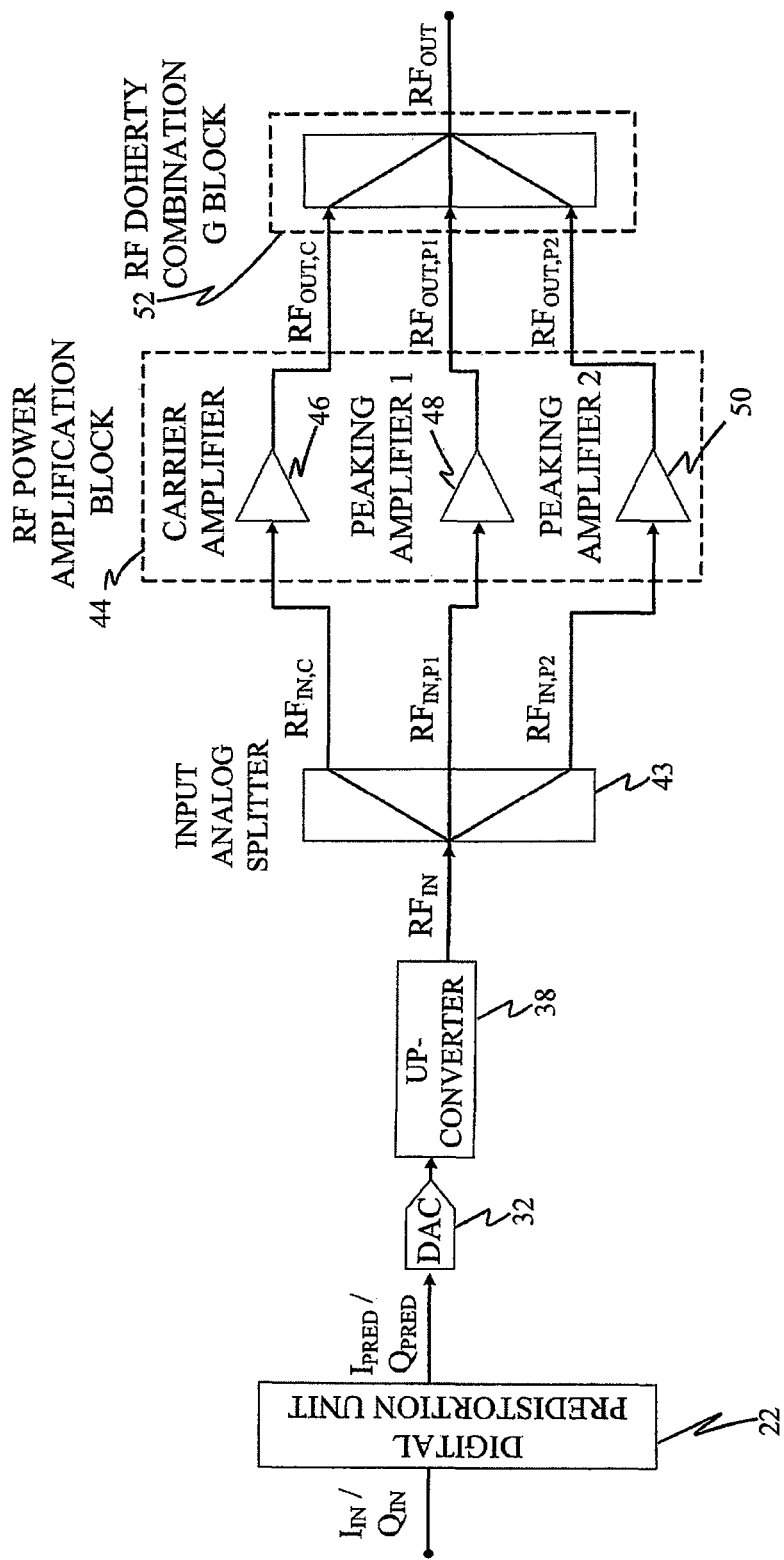
FIG. 6 is a block diagram of the prior art.

Referring to FIG. 6, the Doherty combining network 52 compromises passive structures including quarter wavelength ($\lambda/4$)-transmission line impedance transformers as well as $\lambda/4$-transmission line impedance inverters that are arranged according to a predefined configuration depending on the mode of operation of the multiple branch Doherty transmitter.

Referring to FIG. 6, the general architecture of one kind of multiple branch digital Doherty transmitter, a three-stage digital Doherty transmitter, shown generally at 18 includes an input analog power divider 43 which may be physically located in signal up conversion unit 28 or in RF power amplification unit 44, one carrier amplifier 46 and two peaking amplifiers 48 and 50 and a RF Doherty combining network 52.

Figure 7:
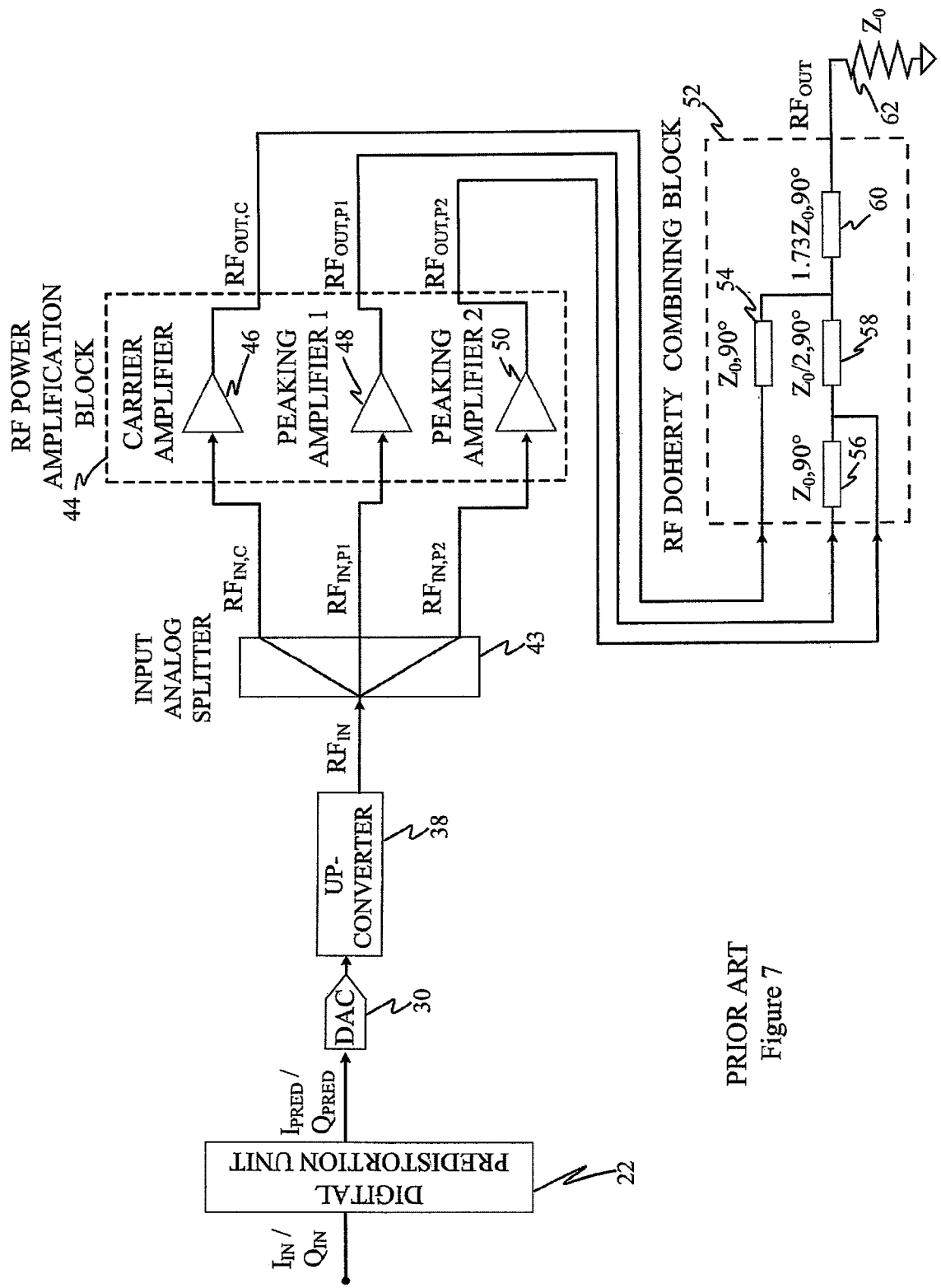
FIG. 7 is an electrical diagram of the prior art.

Referring to FIG. 7, the RF Doherty combining network 52 when the identical devices are used to implement the carrier amplifier and the peaking amplifiers compromises four $\lambda/4$-transmission lines 54 (with characteristic impedances $Z_0$) 58 (with characteristic impedances $Z_0/2$) and 60 (with characteristic impedances 1.734 $Z_0$ 62 is the output load impedance of the three-stage Doherty amplifier.

Figure 8:
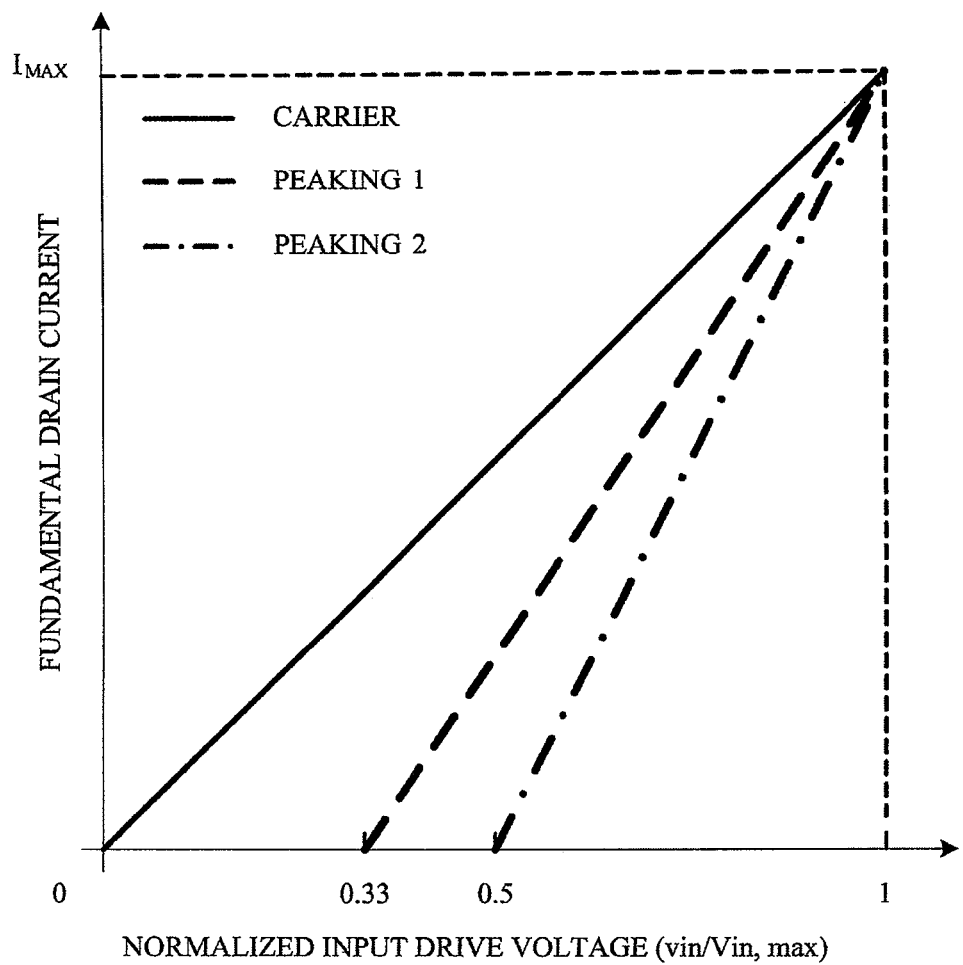
FIG. 8 is a graph illustrating the ideal output currents profile at the fundamental frequency of the circuit of FIG. 7.

Referring to FIG. 8, the ideal currents profile of a three-stage Doherty amplifier, the carrier amplifier 46 and the peaking amplifiers 48 and 50 of which are implemented using identical devices, are such that all output currents are aligned at peak power drive; and, the output current from the carrier amplifier is as twice as the output current of peaking amplifier 48 when peaking amplifier 50 turns ON.

Figure 9:
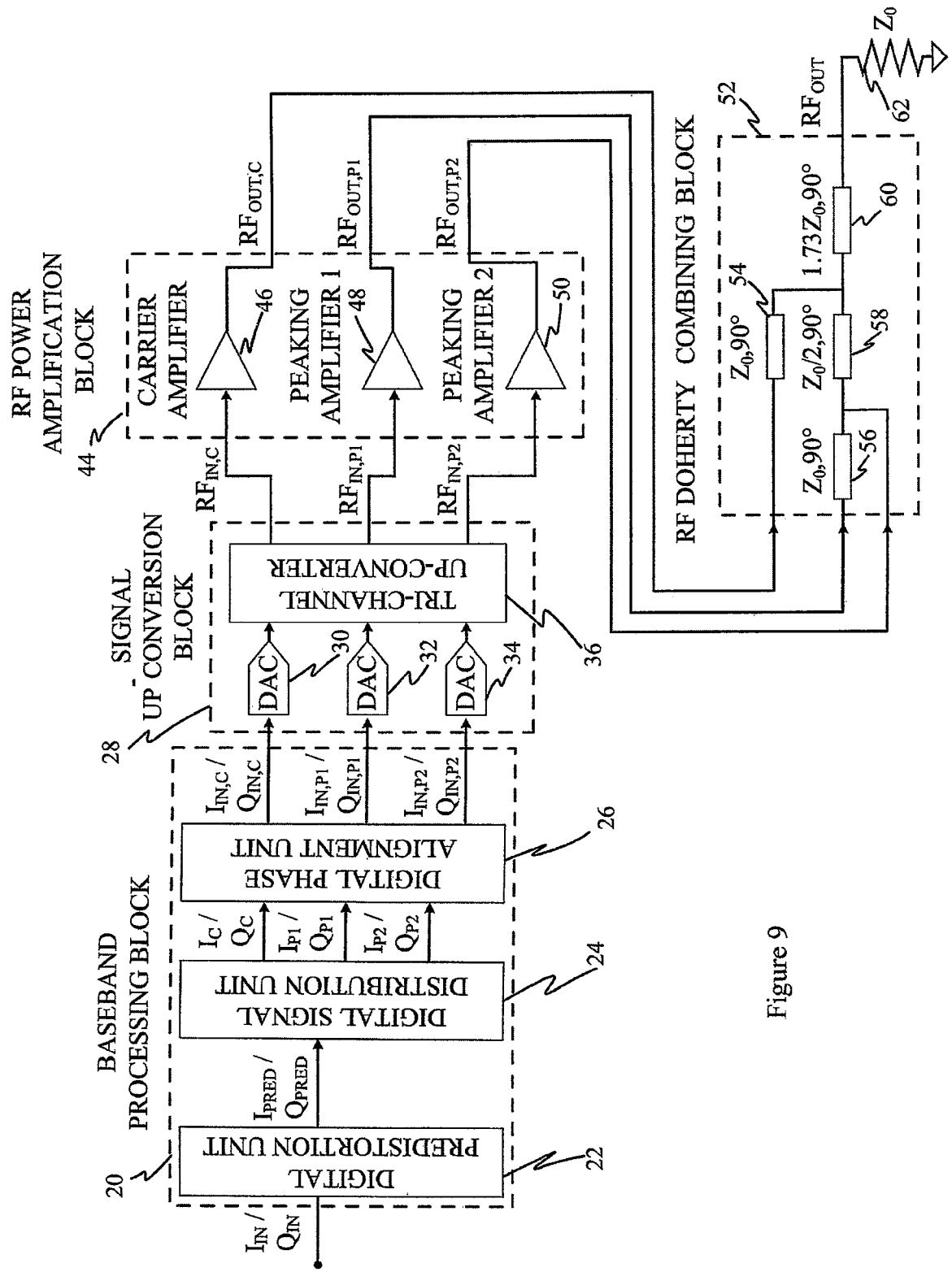
FIG. 9 is an electrical diagram according to an exemplary embodiment of the present invention shown in FIG. 2.
Figure 10:
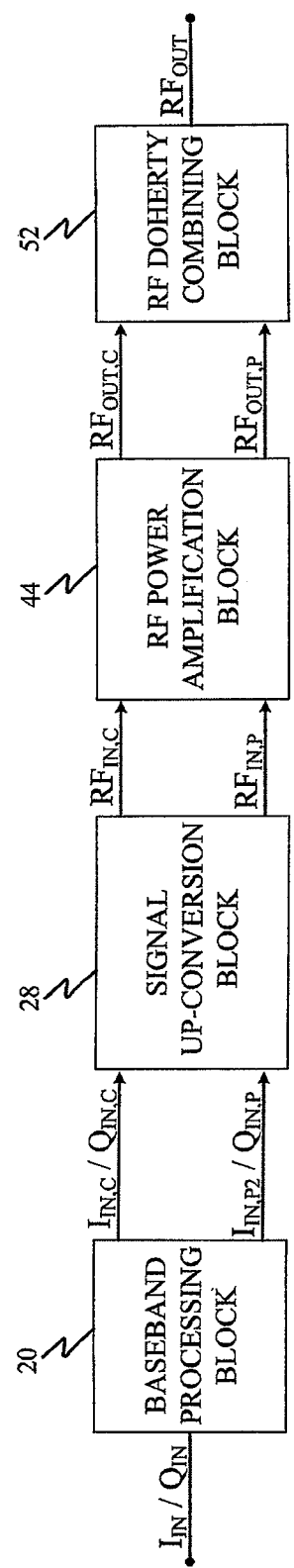
FIG. 10 is a block diagram of the architecture according to an exemplary embodiment of the present invention where the RF power amplification block has only one peaking amplifier.
Figure 11:
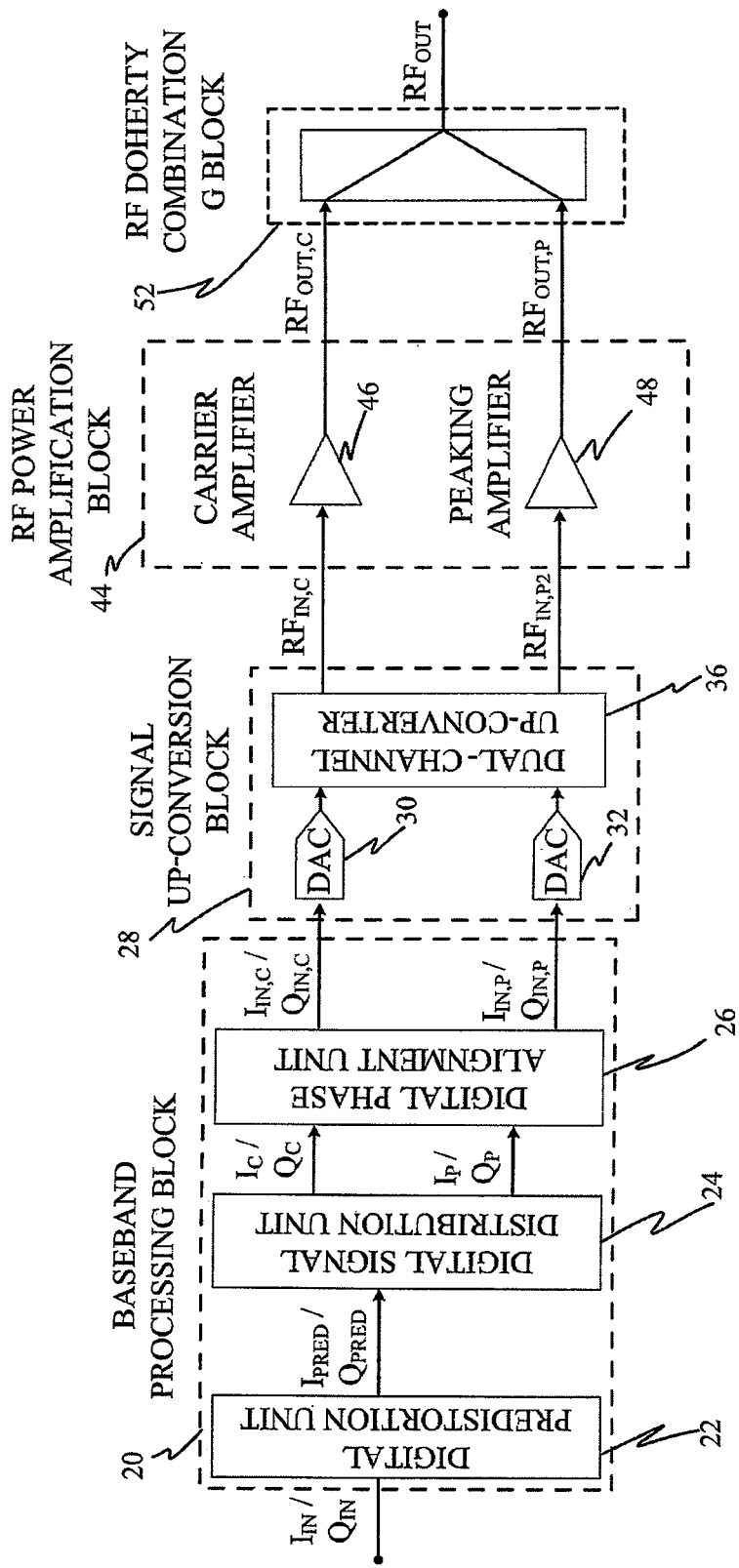
FIG. 11 is another embodiment of the invention architecture shown in FIG. 10, where the RF power amplification block has only one peaking amplifier, and a dual-channel up-converter.
Figure 12:
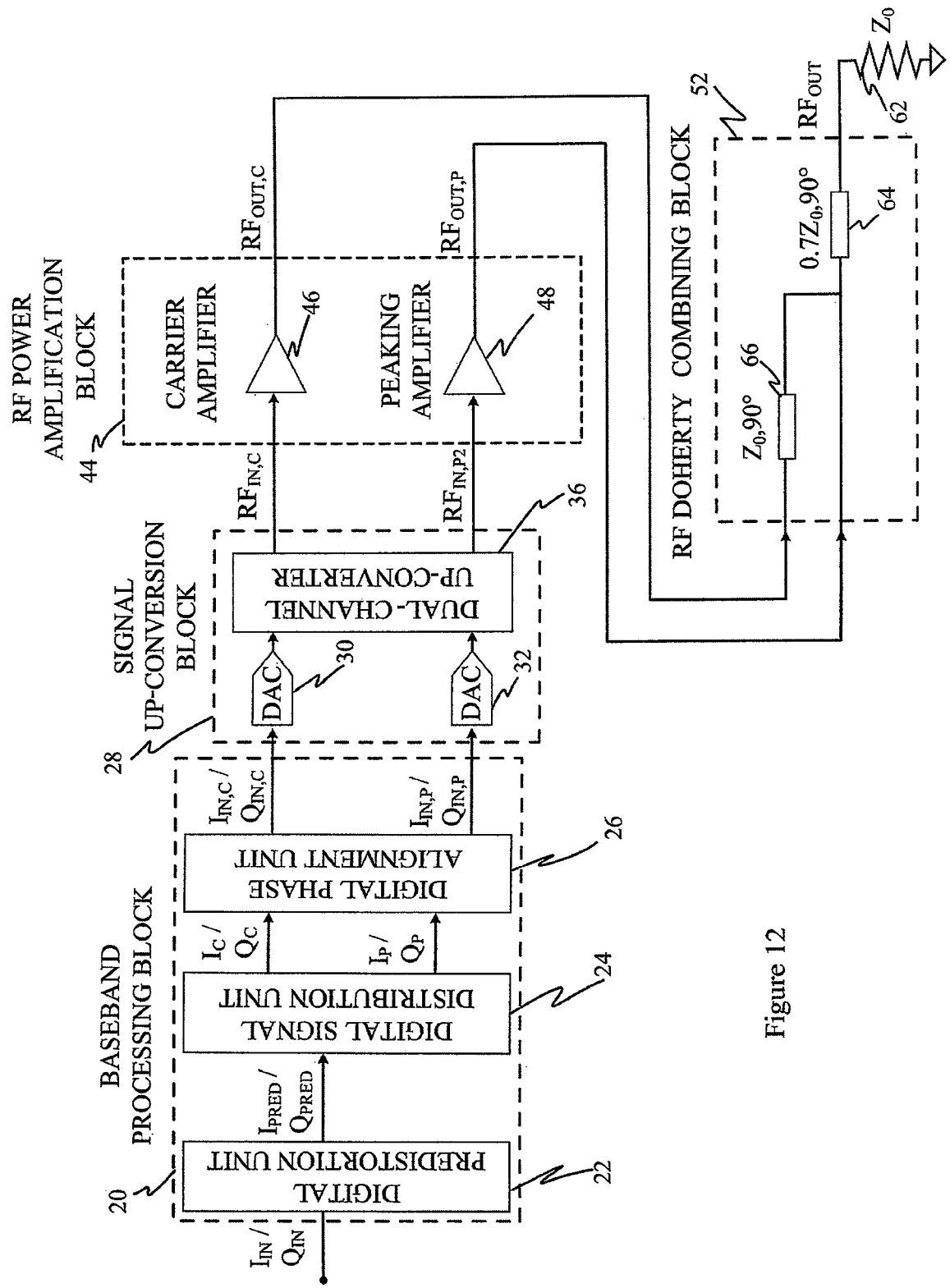
FIG. 12 is an electrical diagram according to an exemplary embodiment of the present invention shown in FIG. 11.
Figure 13:
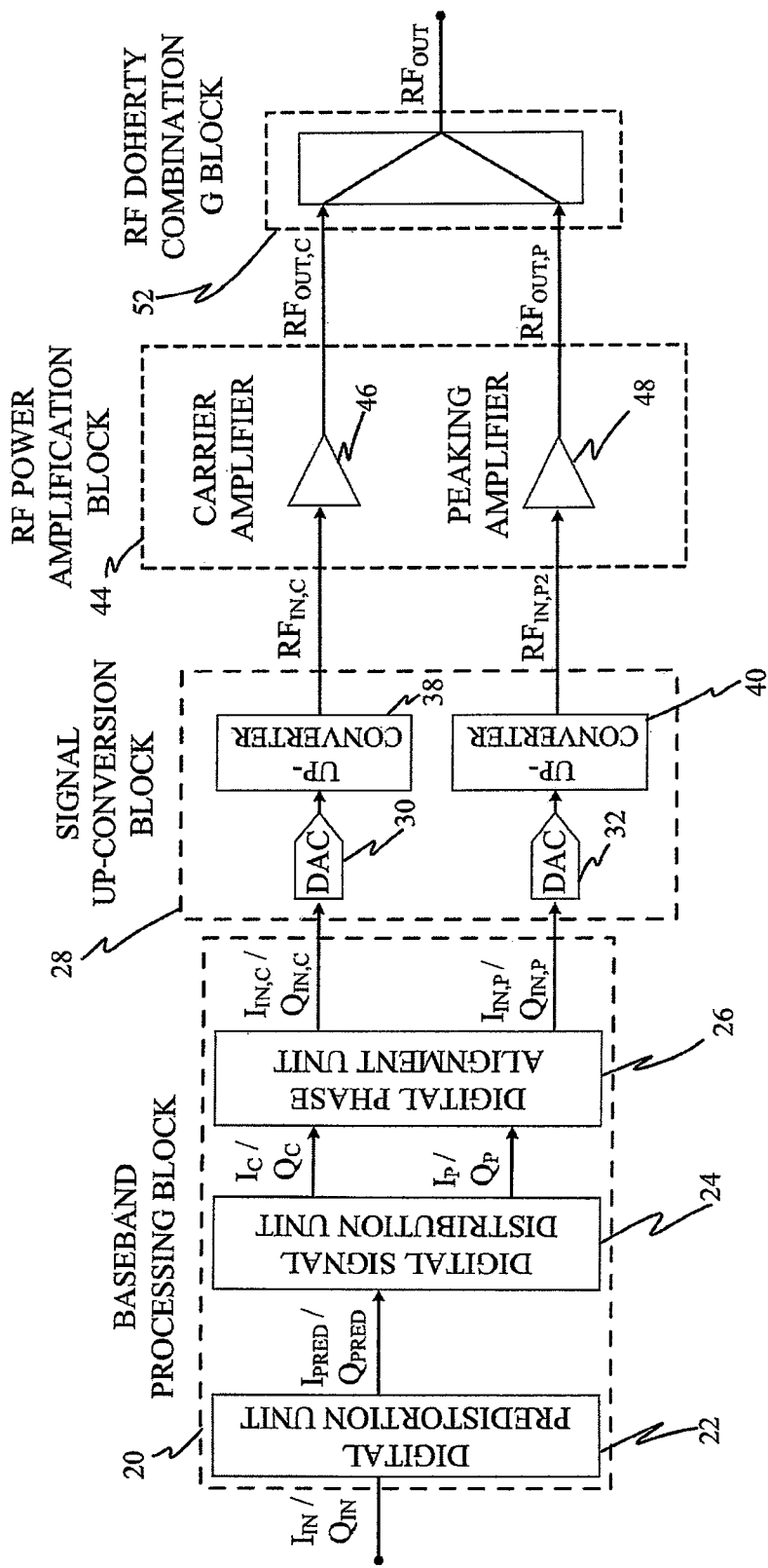
FIG. 13 is another possible block diagram of the architecture of FIG. 10 where the RF power amplification block has only one peaking amplifier, and two single channel upconverters.

FIG. 9 shows an electrical diagram according to an exemplary embodiment of the present invention in which the carrier amplifier 46 and the peaking amplifiers 48 and 50 are built using identical devices.

Figure 18:
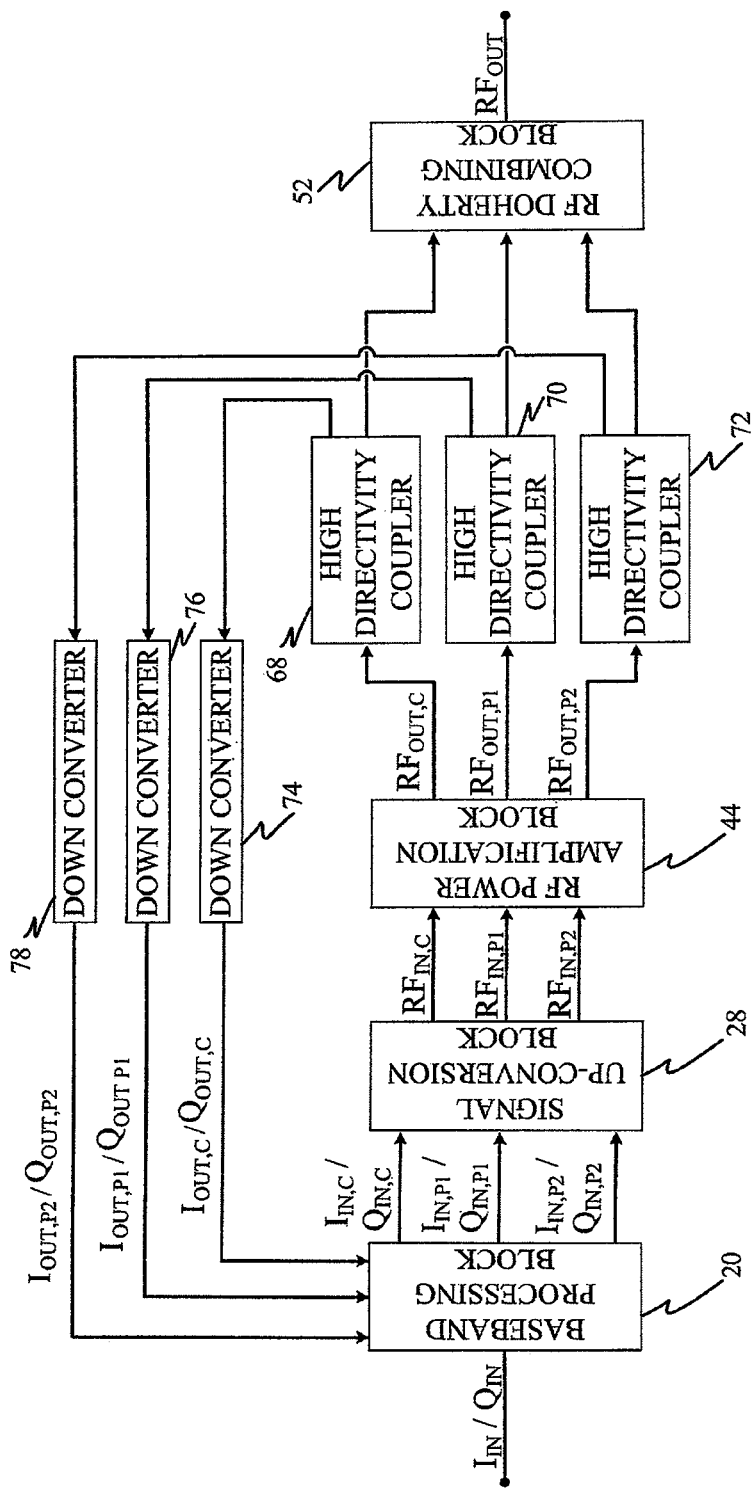
FIG. 18 is a block diagram of the architecture when used in adaptive mode according to an embodiment of the present invention where high directivity couplers are used at the output of the RF power amplification block.
Figure 19:
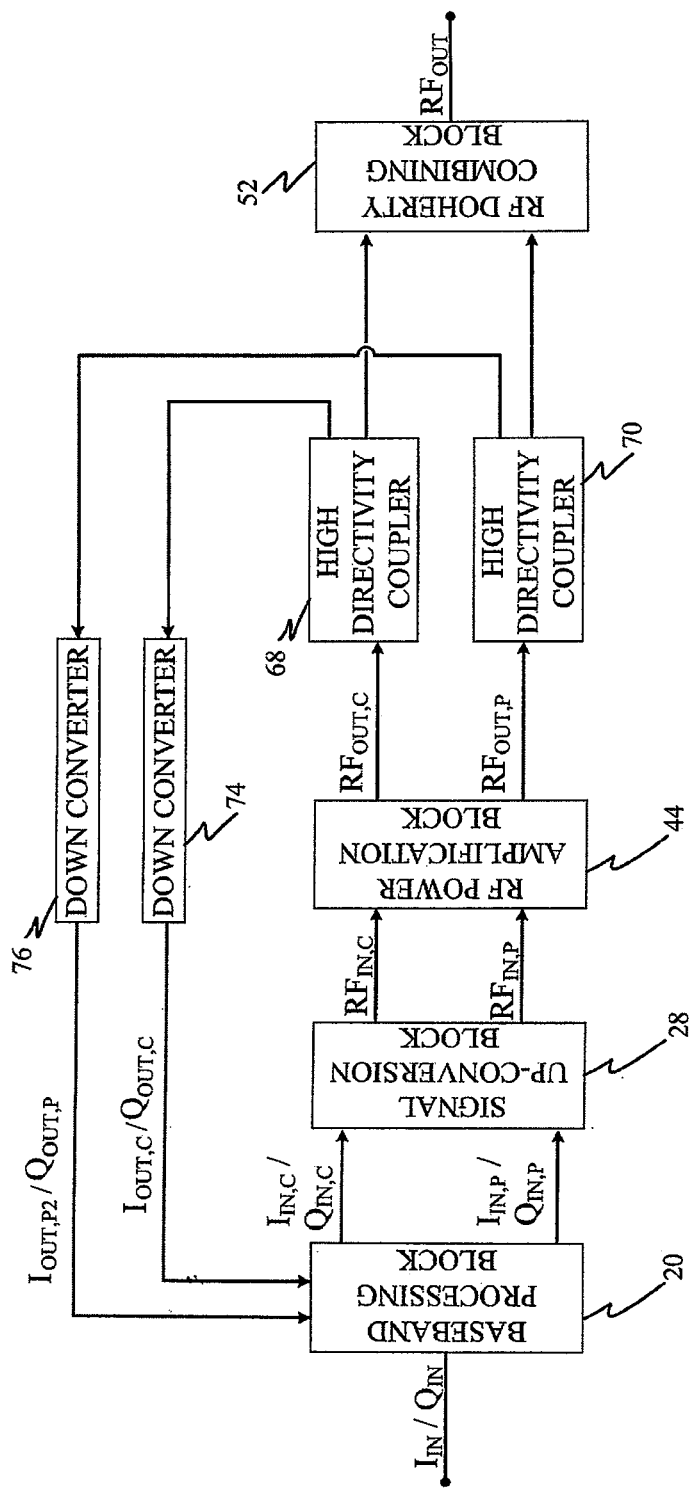
FIG. 19 is a block diagram of the architecture of FIG. 10, where high directivity couplers are used at the output of the RF power amplification block.

Referring to FIGS. 18 and 19, the digital Doherty amplifier may further or alternatively compromise a first, second, and/or third high-directivity coupler 68, 70, 72, respectively, at the out of the carrier amplifier 46 and at the output of each of the peaking amplifiers 48 and 50. The high directivity coupler 68, 70, 72 may be built using passive coupling based structure and embedded within the output matching network of each of the amplifiers of the RF power amplification block 44. The high directivity coupler 68, 70, 72 is used to probe a sample of the output signals of amplifiers in order to: first, continuously monitor their AM/PM responses that may vary with time; and, second, update the input signals as needed.

Figure 20:
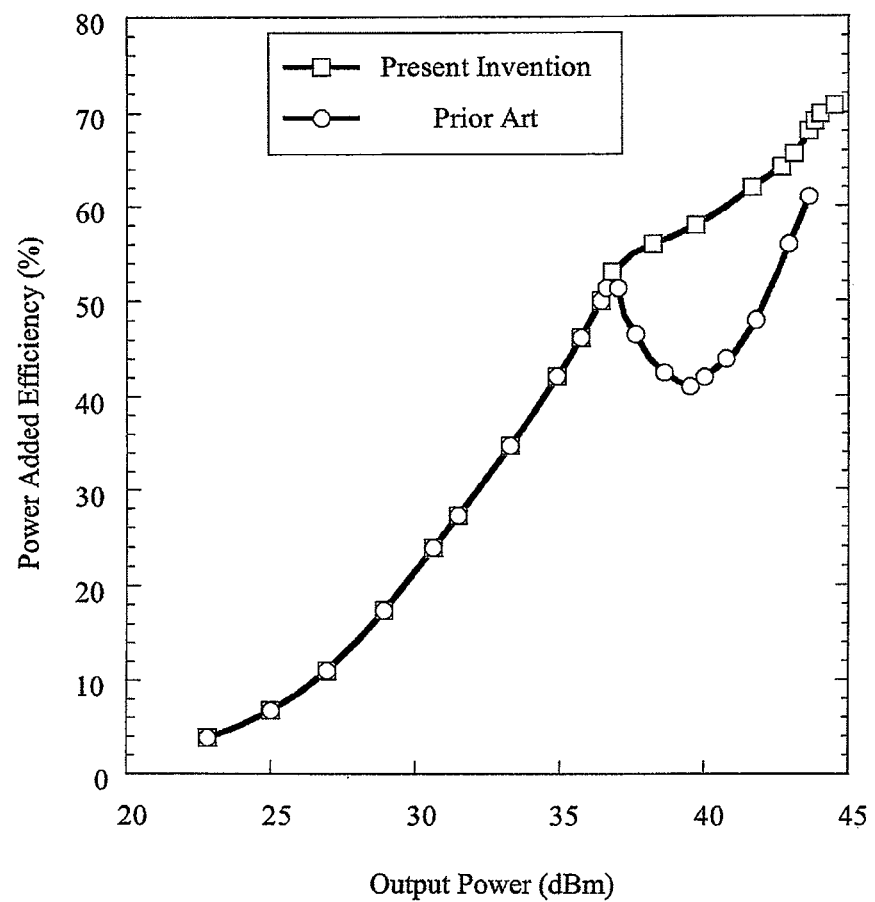
FIG. 20 is the measured performance of the prior art compared to a practical implementation of an exemplary embodiment of the present invention.

FIG. 20 shows the measured power efficiency performance of a practical implementation of an exemplary embodiment of the present invention where the RF power amplification block has only one peaking amplifier and where only digital adaptive phase alignment was applied.

Figure 21:
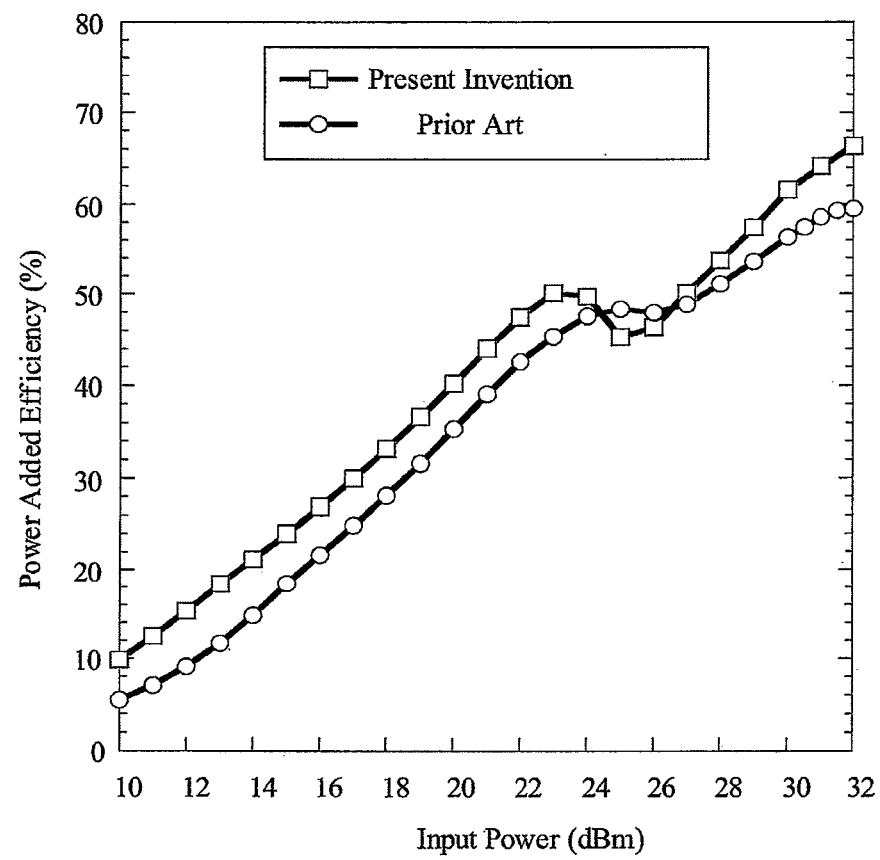
FIG. 21 is another measured performance of the prior art compared to a practical implementation of an exemplary embodiment of the present invention.

FIG. 21 shows the measured performance of the analog Doherty prior art compared to a practical implementation of an exemplary embodiment of the Present Invention (the digital Doherty transmitter of the present invention) where the RF power amplification block has only one peaking amplifier and where only digital adaptive power distribution was applied.

Figure 22:
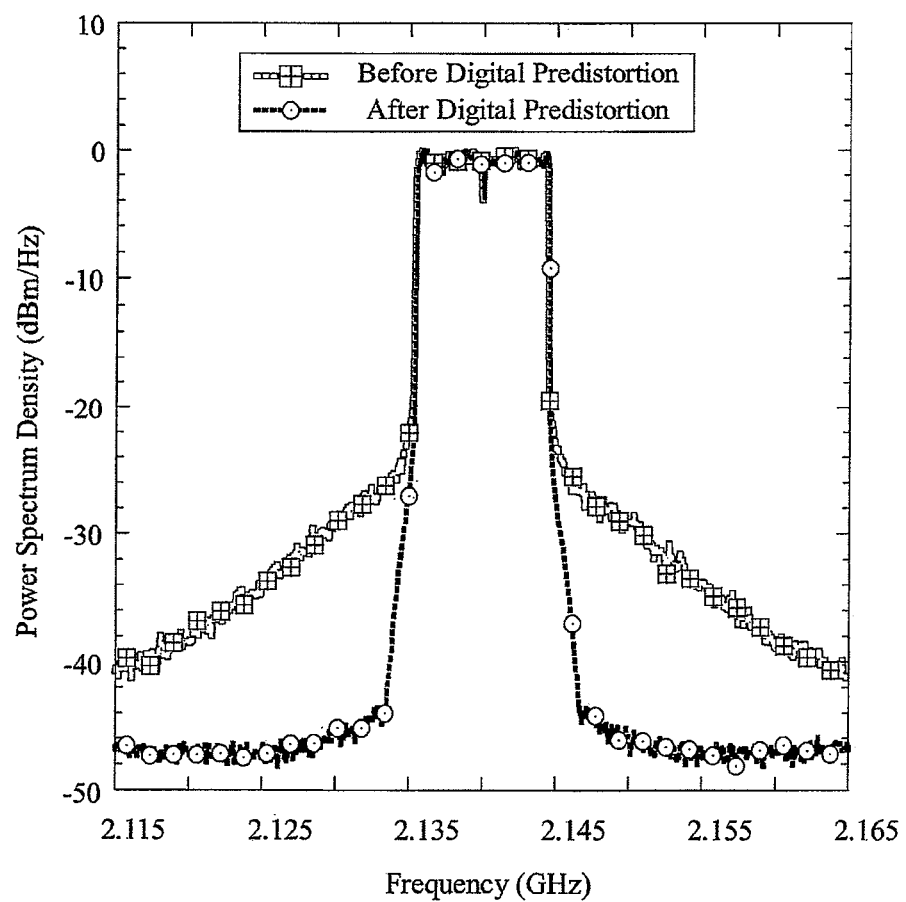
FIG. 22 is the measured performance, in terms of spectrum, of a practical implementation of an exemplary embodiment of the present invention.

FIG. 22 shows the measured performance, in terms of spectrum of a practical implementation of an exemplary embodiment of the present invention where the RF power amplification block has only one peaking amplifier and where digital predistortion in addition power distribution and phase alignment schemes were applied.

As various modifications could be made to the exemplary embodiments, as described above with reference to the corresponding illustrations, without departing from the scope of the invention, it is intended that all matter contained in the foregoing description and shown in the accompanying drawings shall be interpreted as illustrative rather than limiting. Thus, the breadth and scope of the present invention should not be limited by any of the above-described exemplary embodiments, but should be defined only in accordance with the following claims appended hereto and their equivalents.

What is claimed is:

1. A multiple branch transmitter, comprising:
   a. an RF power amplifier block having two or more amplifiers, each amplifier having an input and an output, and each amplifier for amplifying a signal presented at its respective input;
   b. an RF combining network connected to a respective output of said two or more amplifiers for combining signals from each said respective output of said two or more amplifiers; and c. a processing block for distributing portions of an input signal amongst respective inputs of said two or more amplifiers, by generating two or more output signals with dynamically varying complex amplitude ratios in order to achieve a targeted load modulation of the power amplifier block.

2. The multiple branch transmitter of claim 1, wherein said the processing block adaptively distributes a complex amplitude of the input signal between input branches of the RF power amplifier block according to a derived distribution scheme to ensure the targeted load modulation behavior of the power amplifier block.

3. The multiple branch transmitter of claim 2, wherein the targeted load modulation behavior maximizes power efficiency of the multiple branch transmitter over one or more of the transmitter operating frequency range, and power.

4. The multiple branch transmitter of claim 2, wherein the targeted load modulation behavior maximizes linearity of the multiple branch transmitter over one or more of the transmitter operating frequency range, and power.

5. The multi-branch transmitter of claim 1, wherein the RF combining network is implemented using circuit components.

6. The multiple branch transmitter of claim 5, wherein the circuit components are selected from one or more of directional couplers, signal summers, and phase and amplitude controllers.

7. The multi-branch transmitter of claim 1, wherein the load modulation is achieved during signal transmission by interaction between transmission line elements and output load elements connected to the power amplifiers.

8. The multiple branch transmitter of claim 1, wherein the processing block continuously monitors a power envelope of the input signal, and based on the instantaneously monitored power envelope dynamically varies said complex amplitude ratio.

9. The multiple branch transmitter of claim 1, wherein the complex amplitude ratios are a multiple term ratio of complex numbers each representing phases and amplitudes.

10. The multiple branch transmitter of claim 1, wherein the input signal is one of an analog intermediate frequency (IF) signal, analog radio frequency (RF) input signal, digital base-band signal and digital IF signal.

11. The multiple branch transmitter of claim 1, wherein, the one or more of the amplifiers are selected from single-ended amplifiers, push-pull amplifiers, balanced amplifiers, Doherty amplifiers and envelope tracking amplifiers.

12. The multiple branch transmitter of claim 1, wherein the transmitter is implemented using one or more of analog components, analog and digital components, analog and digital components in a single chip, or analog and digital components in a multi-chip format.

13. A method for a multiple branch transmitter, comprising:
amplifying an input signal in an RF power amplifier block having two or more amplifiers, each amplifier having an input and an output, and each amplifier for amplifying a portion of the input signal presented at its respective input;
combining signals from each said respective output of said two or more amplifiers in an RF combining network connected to a respective output of said two or more amplifiers; and
determining a target load modulation of the amplifier block, and distributing portions of the input signal amongst the respective inputs of said two or more amplifiers, by generating two or more output signals with dynamically varying complex amplitude ratios in order to achieve the targeted load modulation of the power amplifier block.

14. The method for the multiple branch transmitter of claim 13, including deriving distribution scheme to ensure the targeted load modulation behavior of the power amplifier block and adaptively distributing a complex amplitude of the input signal between input branches of the power amplifier block according to the derived distribution scheme to ensure the targeted load modulation behavior of the power amplifier block.

* * * * *